United States Patent [19]
Ruelke

[11] Patent Number: 5,767,753
[45] Date of Patent: Jun. 16, 1998

[54] MULTI-LAYERED BI-DIRECTIONAL COUPLER UTILIZING A SEGMENTED COUPLING STRUCTURE

[75] Inventor: Charles R. Ruelke, Plantation, Fla.

[73] Assignee: Motorola, Inc., Schaumburg, Ill.

[21] Appl. No.: 653,164

[22] Filed: May 23, 1996

Related U.S. Application Data

[63] Continuation-in-part of Ser. No. 431,177, Apr. 28, 1995, Pat. No. 5,576,669.

[51] Int. Cl.$^6$ .................................................. H01P 5/18
[52] U.S. Cl. .................................................. 333/116; 333/238
[58] Field of Search .................................................. 333/116

[56] References Cited

U.S. PATENT DOCUMENTS

| | | | |
|---|---|---|---|
| 3,512,110 | 5/1970 | Clar et al. | 333/116 |
| 4,809,356 | 2/1989 | Peckham et al. | 455/86 |
| 5,424,694 | 6/1995 | Maloratsky et al. | 333/112 |
| 5,487,184 | 1/1996 | Nagode | 333/116 X |

FOREIGN PATENT DOCUMENTS

| | | | |
|---|---|---|---|
| 296304 | 12/1991 | Japan | 333/116 |
| 3-296304 | 12/1991 | Japan | H01P 5/18 |
| 1417083 | 8/1988 | U.S.S.R. | 333/116 |

OTHER PUBLICATIONS

Malherbe, J.A.G. and I.E. Losch "Directional Couplers Using Semi–Re–Entrant COupled Lines," Microwave Journal, (Nov. 1987) pp. 121–128.

*Primary Examiner*—Paul Gensler
*Attorney, Agent, or Firm*—Frank M. Scutch, III

[57] ABSTRACT

A multi-layered coupling device (FIG. 9) for coupling radio frequency (RF) energy on a transmission line (302) to a coplanar coupler. The coupling device includes a first coupling structure that is coplanar with the transmission line (302) and parallel plate structure (304) positioned a predetermined distance in a plane parallel to the transmission line (302). The parallel plate structure (304) is not physically connected to any other structure through the use of vias or the like. The parallel plate structure (304) is used to increase the coupling coefficient and directivity of the coplanar structure by being divided into a plurality of segments with varying dimensions to better control coupling capacitances.

10 Claims, 7 Drawing Sheets ns and wire taps. They are used to interconnect devices or subsystems and their functions. Coupling networks have applications in the 1) isolation of dc components; 2) shaping the amplitude or phase-angle transfer function; 3) impedance matching; and 4) real time direct control of causal feedback characteristics. In all cases, the coupler design depends not only upon the parameters of the coupling network, but also upon the specific circuit into which the coupling structure is imbedded.

MULTI-LAYERED BI-DIRECTIONAL COUPLER UTILIZING A SEGMENTED COUPLING STRUCTURE

CROSS REFERENCE TO RELATED APPLICATIONS

This application is a continuation-in-part of Ser. No. 08/431,177 filed Apr. 28, 1995, now U.S. Pat. No. 5,576,669, issued to Charles R. Ruelke on Nov. 19, 1996, and assigned to Motorola, Inc.

TECHNICAL FIELD

This invention relates in general to two-way radios and more particularly to radio frequency (RF) power coupling.

BACKGROUND

Coupling networks are well known in the art and are used in applications from audio to radars and wire taps. They are used to interconnect devices or subsystems and their functions. Coupling networks have applications in the 1) isolation of dc components; 2) shaping the amplitude or phase-angle transfer function; 3) impedance matching; and 4) real time direct control of causal feedback characteristics. In all cases, the coupler design depends not only upon the parameters of the coupling network, but also upon the specific circuit into which the coupling structure is imbedded.

In a typical radio frequency (RF) application, the directional coupler is used in the RF transmitter Automatic Level Control (ALC) circuit. The transmitter ALC senses the power level being produced by the RF Power Amplifier (RFPA) and adjusts the bias of the RFPA to set the RF power output to a desired level. A typical portable's ALC consists of the coupler which "lightly couples" RF energy from the main RF transmission line (between the RFPA and antenna), a rectifier which rectifies the coupled RF energy producing a dc voltage proportional to the RF power level, and a comparator which compares the rectified dc voltage to a reference voltage. The comparator's dc output is connected to the RFPA bias transistors and is adjusted to re-bias the RFPA to the proper power level. This application requires that the coupler induce low insertion loss in the main transmission path between RFPA and the antenna, while at the same time coupling enough energy into the ALC to be properly processed.

Moreover, the typical coupling structure can utilize broad edge or coplanar, microstrip or strip-line transmission structures. The prior art coplanar structure shown in FIG. 1 utilizes paired parallel transmission lines in the same horizontal (edge-to-edge) plane and functions predominantly as an inductive coupling (magnetic field) structure. As seen in FIG. 2, the broad edge coupling structure positions the coupling transmission line such that the width of the coupling transmission line "overlaps" the main transmission line along the vertical axis. The broad edge topology functions predominantly as a capacitive coupling (electric field) structure. In both the broad edge and coplanar topology, the primary RF transmission line is separated from the coupling transmission line by the appropriate distance to achieve the desired level of electromagnetic coupling factor or coupling coefficient. A typical coupling factor of 20 dB will provide for proper ALC functionality with minimal insertion loss. For example, if 1 watt is being transmitted through the main transmission line, then 0.01 watt is being coupled onto the parallel transmission line. By definition, the microstrip transmission line structure uses air as the dielectric medium above the paired transmission lines. As seen in FIG. 3, the strip-line transmission structure is buried into any given dielectric material with ground planes "sandwiching" the dielectric encased coupler structure.

Multiple coupled line structures can be used to effect a bi-directional forward and/or reverse power coupling structure. FIG. 3 shows an example of a coupled line structure utilizing three lines. Forward and reverse (bi-directional) power coupling structures function as a dual mode topology to ensure both proper RFPA power levels and to cutback the RFPA power in the event of a fault in the transmitter system. The forward coupling transmission line senses the forward RF energy (power to the antenna); therefore, the dc voltage generated from the rectified forward coupled energy is directly proportional to the forward traveling RF energy. In the event of a transmitter system fault ( i.e. an open in the antenna) the RF energy is reflected back from the antenna towards the RFPA. Serious or catastrophic RFPA damage can result if the RFPA continues to transmit full power under a fault condition.

To protect against RFPA damage, a reverse power (power to the RFPA) cutback circuit using a reverse power coupling transmission line structure can be added to sense the level of reflected RF energy. As with the forward ALC topology, the reverse RF energy is rectified and the dc voltage from the reverse coupled structure is directly proportional to the reverse traveling RF energy. The bi-directional coupling factors can be independently set by variations in the geometries of the individual coupling transmission line and can be predicted using standard field solver techniques.

The electrical differentiation between the forward and reverse structure depends upon the placement of the termination impedances, control of the transmission line characteristic impedance and coupler separation from the primary transmission line. Directivity is a measure of the bi-directional coupler differentiation. The algebraic difference in gain measured in decibels (dB) of the forward and reverse coupling coefficients for any fixed structure is defined as the directivity of that structure. A 20 dB directivity factor is considered acceptable for a bidirectional coupler. This means that if a forward coupling structure measures a forward coupling coefficient of 20 dB, that the reverse coupling coefficient for that same structure will measure 40 dB; thus the directivity for the forward coupler is said to be 20 dB. The lower the directivity factor, the less sensitivity the ALC will have in differentiating between forward and reverse RF energies.

The coupler structure is critical to proper ALC functionality and protection of the RFPA. The bi-directional coupler design requires minimizing manufacturing tolerance effects and closed loop variations. Printed circuit board (PCB) board manufacturing variations in transmission line widths and inner-layer dielectric thicknesses have usually prevented the coupler from being embedded into the RF (printed circuit board) itself. Historically, high performance bi-directional couplers have been fabricated on a substrate such as alumina, with thin film processes and their tight tolerance capability defining the coupler geometries to achieve a controlled 20 dB coupling coefficient with greater than 20 dB of directivity. Although the modularized approach to implementing the coupler is effective, it adds cost and process steps that could otherwise be eliminated if the coupler were to be embedded into the PCB itself. To achieve high reliability coupler performance with existing PCB make tolerances of ±2 mil gaussian width distributions requires an innovative design approach. Therefore, the need exists for an embedded PCB coupler structure which achieves an acceptable coupling coefficient and directivity without the use of vias or mechanical coupling devices.

SUMMARY OF THE INVENTION

The preferred embodiment of the invention includes a multi-layered coupling device for coupling radio frequency (RF) energy on a transmission line to a coplanar coupler. The coupling device includes a first coupling structure that is coplanar with the transmission line and parallel plate structure positioned a predetermined distance in a plane parallel to the transmission line. The parallel plate structure is not physically connected to any other structure through the use of vias or the like. The parallel plate structure is used to increase the coupling coefficient and directivity of the coplanar structure by being divided into a plurality of segments with varying dimensions to better control coupling capacitances.

DETAILED DESCRIPTION OF THE PREFERRED EMBODIMENT

Figure 4:
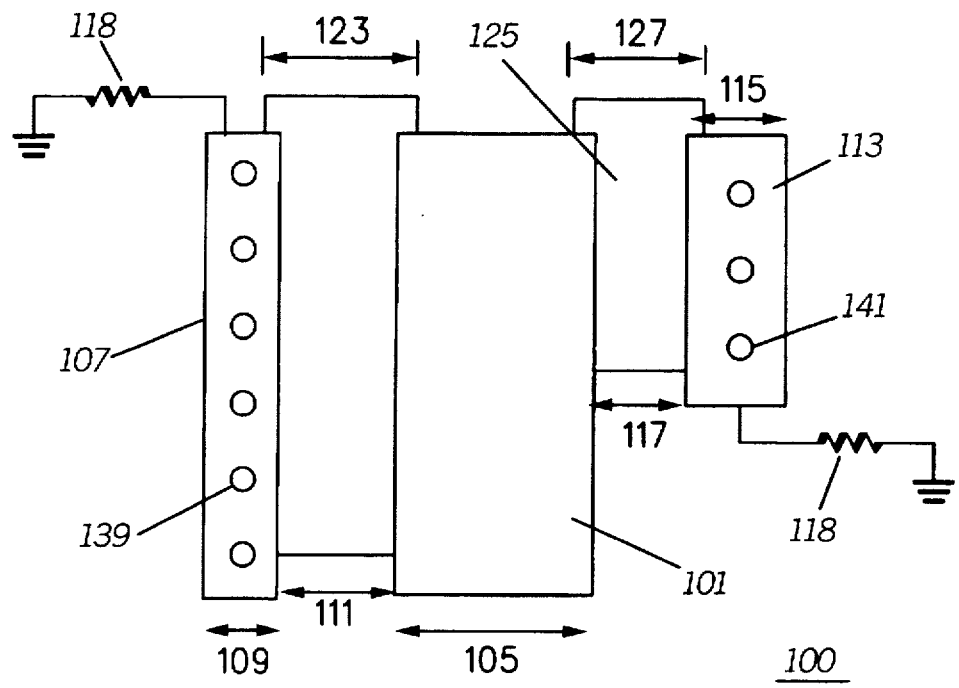
FIG. 4 is a top view of a multi-layered bidirectional microstrip coupler in accordance with the invention.
Figure 5:
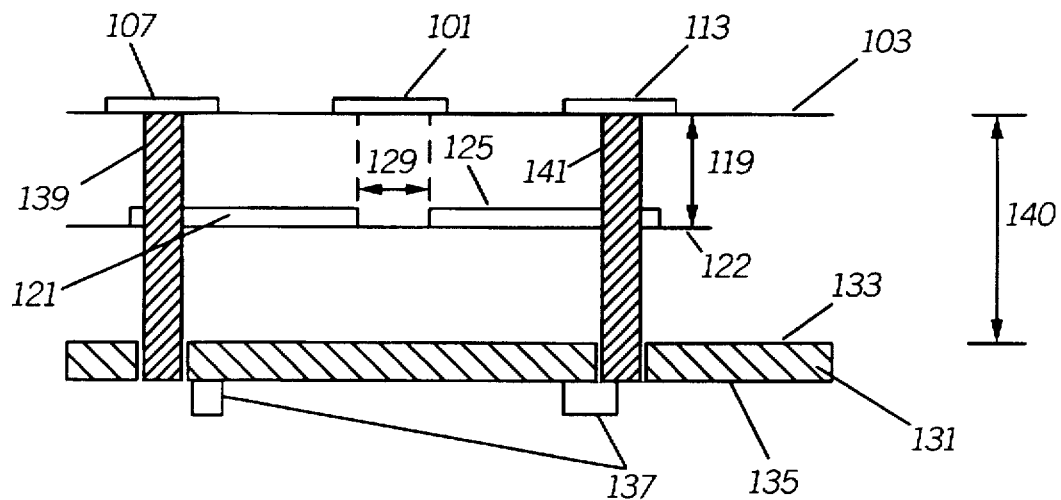
FIG. 5 is a side view of that shown in FIG. 4.

Referring now to FIGS. 4 and 5, a multi-element microstrip coupler structure 100 is a device for bi-directionally coupling RF energy and is shown as placed on a multi-layer printed circuit board. The microstrip coupler structure 100 includes a radio frequency (RF) transmission line 101 which is positioned upon first outer substrate 103. RF transmission be 101 has a specific width 105 and is generally attached to an RF source such as an RF power amplifier (not shown) which conveys RF energy at a specific frequency. The width 105, dielectric constant of the first outer substrate 103, and the distance 140 are those parameters which determine the characteristic impedance and velocity factor of the RF transmission line 101.

A forward power coupler 107 is positioned on the first outer substrate 103 adjacent to the RF transmission line 101. A forward power coupler 107 has a width 109 and is separated from the RF transmission line 101 by a distance 111. The width 109 and distance 111 determine the degree to which forward power coupler 107 is electro-magnetically coupled to the RF transmission line 101. The forward power coupler 107 is used to couple RF energy from RF transmission line 101 which is moving only in a forward or outwardly direction from the RF source (not shown).

Similarly, a reverse power coupler 113 is positioned on the opposite side of the RF transmission line 101 and has a width 115 and is separated from the RF transmission line 101 by a distance 117. The width 115 and distance 117 determines the degree to which reverse power coupler 113 is coupled to the RF transmission line 101. It should be recognized by those skilled in the art, the reverse power coupler 113 may be different in dimensions than the forward power coupler 107 because of specified design constraints requiring a different reverse coupling factor. However, if design requirements dictate, the function of the forward power coupler 107 and the reverse power coupler 113 can be reversed by relocating their respective termination impedances 118 to the opposite end of the affected transmission line. The composite coupling structure utilizing the forward power coupler 107, RF transmission line 101, and reverse power coupler 113 are positioned on the first outer substrate 103 and function as a coplanar bi-directional microstrip coupler.

Positioned below the first outer substrate 103 at a distance 119, a first coupling structure 121 is aligned on the inner substrate 122 between RF transmission line 101 and the forward power coupler 107. The first coupling structure 121 is essentially a flat conductive plate having a width 123 and works to increase the coupling coefficient and directivity between the RF transmission line 101 and the forward power coupler 107. The coupling coefficient and directivity are as defined above.

Similarly, a second coupling structure 125 is positioned adjacent to the first coupling structure 121 and is aligned on an inner substrate 122 between the RF transmission line 101 and a reverse power coupler 113. The second coupling structure 125 is also essentially a flat conductive plate having a width 127 and also works to increase directivity and coupling coefficient between the RF transmission line 101 and the reverse power coupler 113. The first coupling structure 121 and the second coupling structure 125 are oriented in substantially the same plane parallel to RF transmission line 101 and are separated on an inner substrate 122 by distance 129. The composite coupling structures comprised of first coupling structure 121 and second coupling structure 125 function as a partial broad edge bi-directional coupler to transmission line 101 on the first outer substrate 103.

Located below the inner substrate 122, a second outer substrate 131 includes a conductive ground layer 133 on its inner side. The outer side 135 of the second outer substrate 131 is used to mount discrete components 137 which may be interconnected using surface runners (not shown) or the like. Finally, one or more vias 139 are used to connect the forward power coupler 107 to the first coupling structure 121. Thus, each via 139 must extend from the first outer substrate 103 through inner substrate 122 and may further extend to the second outer substrate 131. Each via 139 does not connect to the ground layer 133. Similarly, one or more vias 141 are used to connect reverse power coupler 113 to the second coupling structure 125. The vias 141 extend from the first outer substrate 103, through inner substrate 122 and may further extend to the second outer substrate 131 without connecting to the ground layer 133. It should be recognized by those skilled in the art, that via(s) 139 and via(s) 141 are shown as through hole vias but blind vias or buried vias could also be used.

Thus, the composite coupling structure functions as a hybrid combination of a coplanar and broad edge coupler embedded into the PC board with added components interconnecting the coupler to any supporting circuitry. Assuming standard fire retarding epoxy resin/glass cloth laminate (FR4) material is used in the construction of the printed circuit board, typical widths and distances for the microstrip coupler structure 100 range between 20 mils and 180 mils depending on specific design requirements and printed circuit board parameters.

Figure 6:
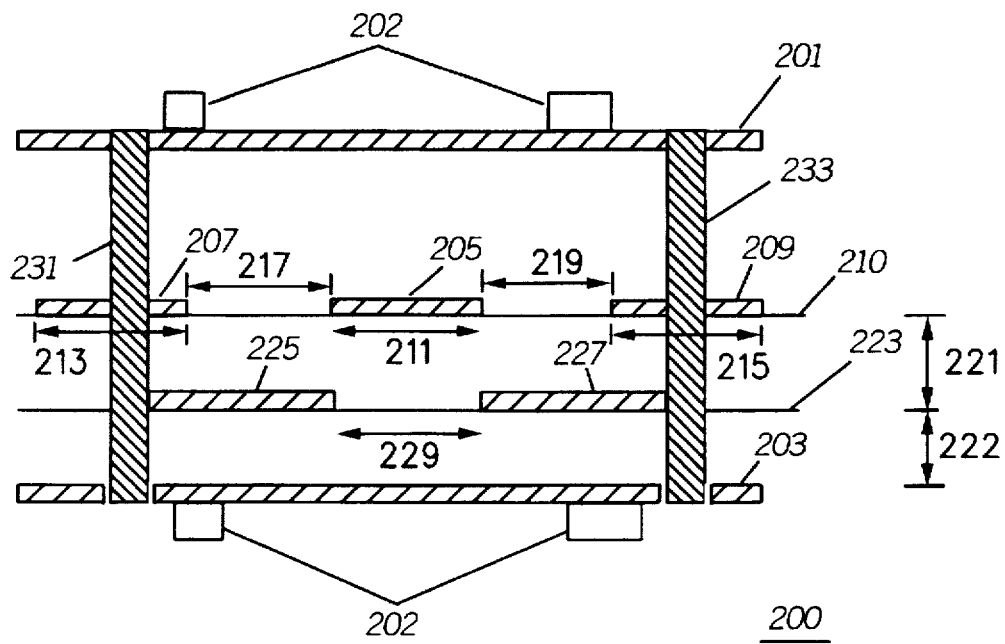
FIG. 6 is a side view of a multi-layered bi-directional stripline coupler using lower parallel plate structures in accordance with an alternative embodiment of the invention.

In yet another embodiment shown in FIG. 6, a stripline coupler structure 200 includes a first outer ground layer 201 and a second outer ground layer 203. The microstrip coupler structure 100 differs from the stripline coupler structure 200 due to the presence of the first outer ground layer 201 and the second outer ground layer 203 exterior to or sandwiching the coupling transmission lines. The outer ground plates on the respective ground layers act to isolate the coupling structure from extraneous RF sources that may degrade coupling performance. Any number of component parts 202 may be positioned on the outer surface of both the first outer ground layer 201 and second outer ground layer 203.

The stripline coupler structure 200 further includes an RF transmission line 205, forward power coupler 207 and a reverse power coupler 209 each positioned on a first substrate 210. RF transmission line 205 has a width 211, forward power coupler 207 has a width 213 and reverse power coupler 209 has a width 215. The width 211 is used to control impedance and velocity factor of the RF transmission line 205 while the width 213 and width 215 are used to control the respective coupling coefficient of the forward power coupler 207 and reverse power coupler 209. The forward power coupler 207 is separated from the RF transmission line 205 by a distance 217 while reverse power coupler 209 is separated from RF transmission line 205 by distance 219. Distance 217 and distance 219 also control coupling coefficient and directivity of each respective coupler.

Positioned at a distance 221 below the first substrate 210 and at a distance 222 above the second outer ground layer 203, a second substrate 223 is used to align a first coupling structure 225 between the RF transmission line 205 and the forward power coupler 207. A second coupling structure 227 is also aligned below RF transmission line 205 and reverse power coupler 209. Both the first coupling structure 225 and second coupling structure 227 function as broad edge couplers to the RF transmission line 205 and are used to increase directivity and coupling factor. The first coupling structure 225 and the second coupling structure 227 are separated by a distance 229 designed to minimize undesired coupling between these structures.

Finally, one or more vias 231 are used to connect the forward power coupler 207 to the first coupling structure 225. Thus, each via 231 extends from the first outer ground layer 201 through first substrate 210, second substrate 223 to the second outer ground layer 203. Each via 231 connects the forward power coupler 207 to the first coupling structure 225. Similarly, one or more vias 233 are used to connect reverse power coupler 209 to the second coupling structure 227. The vias 233 extend from the first outer ground layer 201, through the first substrate 210 and second substrate 223 connecting to these structures.

Figure 7:
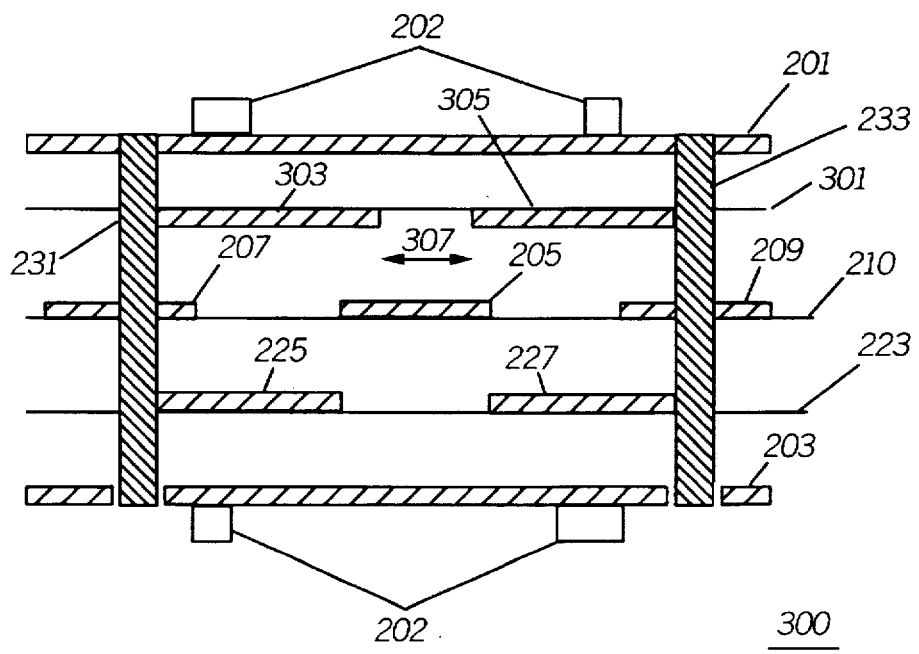
FIG. 7 is a side view of a multi-layered bi-directional stripline coupler using upper and lower parallel plate structures in accordance with an alternative embodiment of the invention.

FIG. 7 shows another embodiment of a stripline coupler structure 300. All components are identical except for the addition of a third substrate 301 which is located above or adjacent to first substrate 210. Positioned on third substrate 301 are third coupling structure 303 and fourth coupling structure 305 which provide additional coupling from RF transmission line 205 to forward power coupler 207 and reverse power coupler 209. Third coupling structure 303 and fourth coupling structure 305 are separated by a distance 307.

Figure 8:
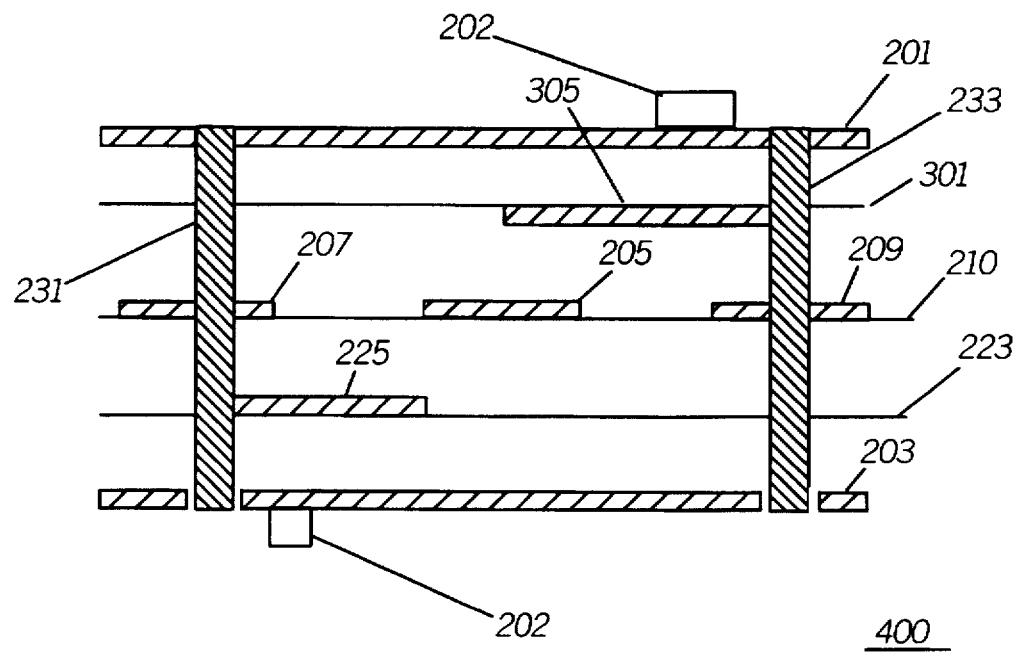
FIG. 8 is a side view of a multi-layered bi-directional stripline coupler using upper and lower parallel plate structures which are toggled in accordance with an alternative embodiment of the invention.

FIG. 8 shows yet another embodiment of a stripline coupler structure 400. In this configuration, the first coupling structure 225 and fourth coupling structure 305 are used in a toggle or staggered formation. This configuration may be used over that shown in prior art FIGS. 1 and 2 to provide the desired amount of coupling between the RF transmission line 205, forward power coupler 207 and reverse power coupler 209. It should be evident to those skilled in the art that second coupling structure 227 and third coupling structure 303 may be used in a toggle configuration as well. It should also be recognized by those skilled in the art that while the preceding discussion is predominately concerned with bi-directional coupler structures, a similar hybrid uni-directional coupler may also be constructed utilizing the same principles by eliminating the unnecessary coupling transmission lines.

Figure 1:
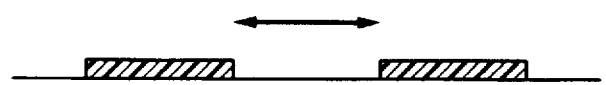
FIG. 1 is a side view of a coplanar coupled transmission line pair.
Figure 2:
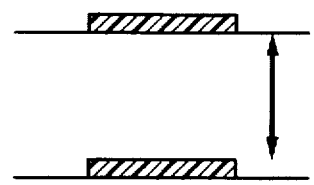
FIG. 2 is a side view of a broad edge coupled transmission line pair.
Figure 3:
FIG. 3 is a side view of a conventional coplanar bi-directional stripline coupler.
Figure 3:
Figure 3:

As noted above, the purpose of designing on-board coupling structures is to improve the functional performance of the coupler while at the same time simplifying the radio manufacturing process. The method of improving the performance of a coplanar coupling structure, as shown in FIG. 1, utilizing a secondary "floating" plate is well known in the art. All floating plate coupling structures using the "broad edge" topology, as seen in FIG. 2, create the added coupling through capacitive strays between the coplanar coupler and floating plate. This stray capacitance is defined by the well known parallel plate capacitance Equation (1):

$$C = (eA/D) \tag{1}$$

where: C=stray capacitance between parallel plates; e=dielectric of material between plates; A =surface area of plate overlap region; and D=distance separating plates.

Generally, the stray capacitance, provided by the coupling structure or floating plate, improves the coplanar coupling performance and can be well defined mathematically using conventional techniques. Using the principles of this invention, a structural design is provided that reliably improves the coupling factor while at the same time allowing for existing manufacturing process variations. The invention utilizes existing manufacturing processes, saving time and cost, since no new PC board (PCB) process innovations are needed.

The effect of manufacturing process variations in RF PCB's is to change all three parameters i.e. dielectric constant (e), surface area (A), and separation distance (D). The greatest variance is usually in area (A) and distance (D) relative to functional dimensions presently used in today's RF PCB platforms. For example, if a runner width variation is ±2 mil for both a 10 mil or 20 mil wide plate, it is easily understood that the variance as a percentage of the plate width is much less severe for the 20 mil plate. However, increasing the width of the plate requires the designer to proportionally increase the plate separation (D) to maintain the same desired stray capacitance. This adds size to the overall structure and can make meeting dimensional constraints or limitations extremely difficult. To mitigate this limitation, it becomes necessary to introduce some innovations in the parallel plate geometry to accommodate both small physical dimensions, while at the same time maintaining reliable and manufacturable coupling performance.

Figure 9:
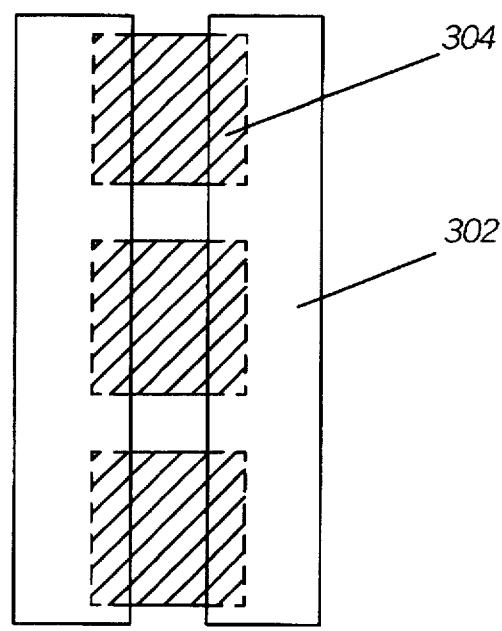
FIG. 9 is a top view of an alternative embodiment of a multi-layered bi-directional microstrip coupler as seen in FIG. 4, except vias are not used to connect the upper and lower structures and a plurality of segments form the floating parallel plate coupling structure.

The innovations in plate geometry generally incorporate one common characteristic. They all tend to form a segmented floating plate structure that tends to distribute the stray capacitance in multiple sections, rather than introducing a single parallel plate that traverses the entire length of the coplanar coupling structure. This is shown in an alternative embodiment of FIG. 9, which illustrates a "dashed line" geometry using no interconnecting vias and where breaks or gaps are introduced in the floating plate structure. In FIG. 9, a microstrip structure 302 incorporates a lower floating plate structure 304 which is segmented into multiple parts or sections. This allows the floating plate to incorporate increased plate width (20 mil) and smaller plate separation (D), while at the same time offsetting the increase this causes in coupling capacitance by reducing plate surface area (A). A generalization of FIG. 9 is shown in FIGS. 10 and 11 (FIG. 11 is a cross sectional view of FIG. 10) where Equation (2) describes the coupling capacitance for this structure as:

$$C_{total}=(e)\ (A1/D1+A2/D2+A3/D3+\ldots) \qquad (2)$$

where $C_{total}$=total stray capacitance formed by all parallel plates; e=dielectric of material between plates; A1, A2 . . . =surface area of overlap region for plate 1, 2, . . . ; and D1, D2 . . . =distance separating plate 1, 2, . . .

Figure 10:
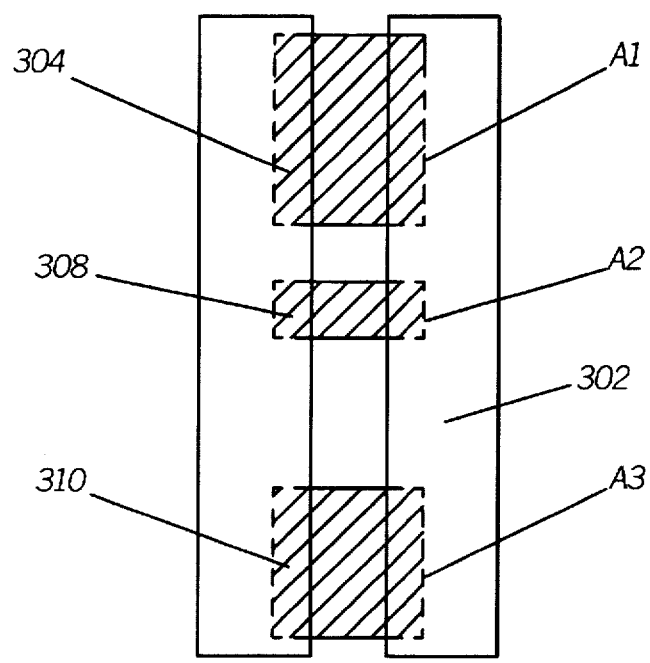
FIG. 10 is a top view of an alternative embodiment of a multi-layered bi-directional microstrip coupler as seen in FIG. 9 which uses a plurality of segments in the floating parallel plate coupling structure having various geometric widths.
Figure 11:
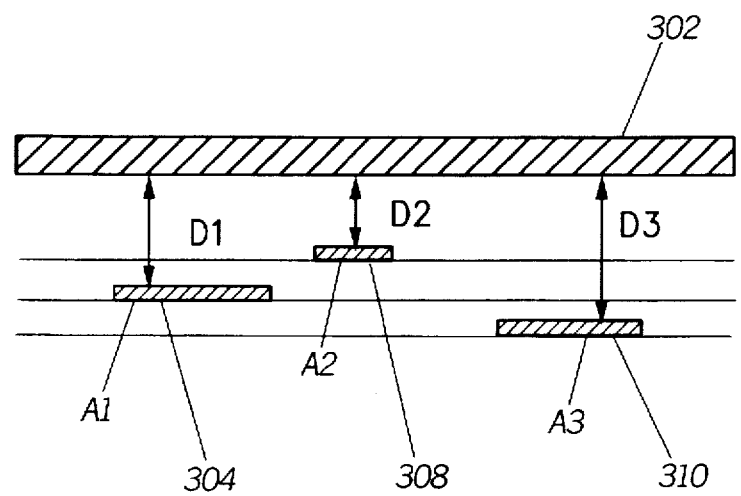
FIG. 11 is a side of the parallel plate coupling structure as shown in FIG. 10 where each plate segment is separated from the coplanar microstrip by varying distances.

In FIGS. 10 and 11, the distances D1, D2, D3 and the areas A1, A2, A3 can be equal such that the capacitive coupling for each plate section are equal. However it will be recognized by those skilled in the art that this is not absolutely necessary. In FIG. 9, the microstrip structure 302 incorporates floating plates 304, 308 and 310 which vary in size and are separated from microstrip 302 by distances D1, D2 and D3 respectively. Additional flexibility can be afforded in meeting layout restrictions by changing both plate separation and area for any given section. The important factor is that the total stray capacitance created by the cumulative capacitance from each plate section is equal to the design requirements. An illustration of a coupling structure having multiple sections with unequal A and D is shown in FIGS. 10 and 11. The geometry of each section can also be modified to accommodate dimensional or manufacturing constraints.

Figure 12:
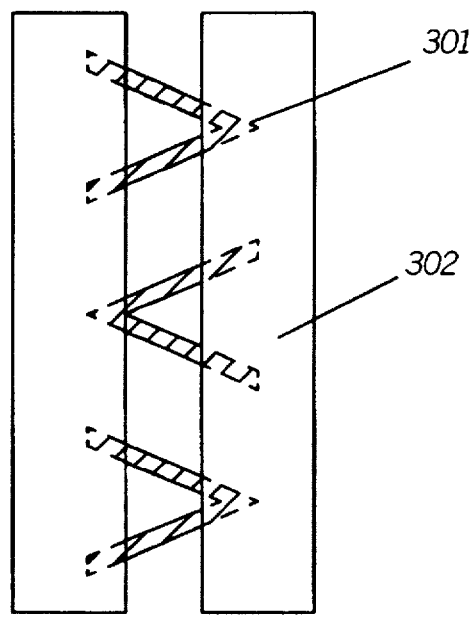
FIG. 12 is a top view of an alternative embodiment of the floating parallel plate coupling structure wherein the parallel plate is in a segmented "V" configuration.
Figure 13:
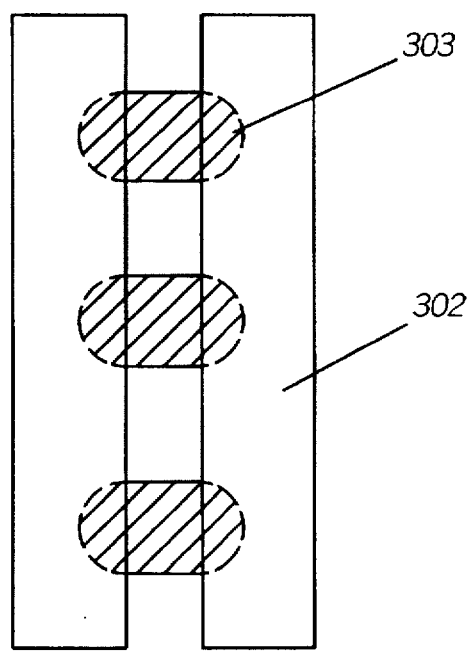
FIG. 13 is a top view of an alternative embodiment of the floating parallel plate coupling structure wherein the parallel plate is in a segmented oval configuration.

These examples are illustrated in FIG. 12, where the area of the floating plate is reduced by providing a series of substantially "V" shaped segments 301. In FIG. 13 the area of the floating plate is reduced by providing a series of substantially circular or oval segments 303. In both FIGS. 12 and 13, the floating plates are positioned below microstrip structure 302.

Figure 14:
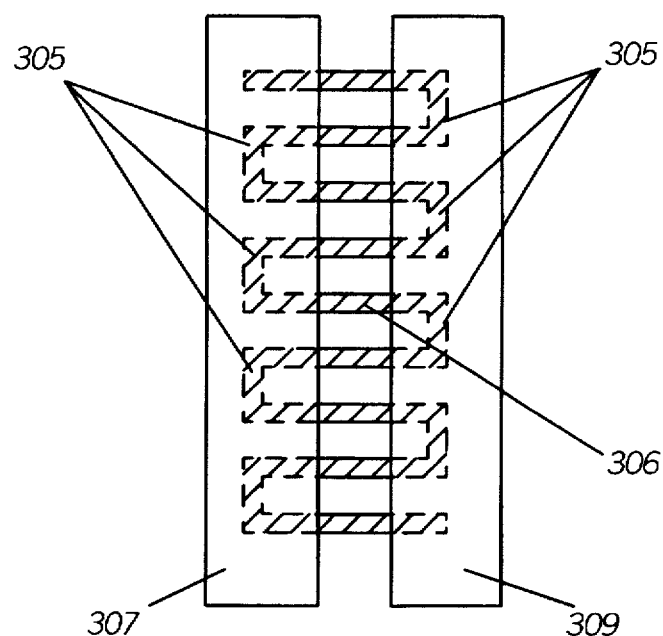
FIG. 14 is a top view of an alternative embodiment of the floating parallel plate coupling structure wherein the parallel plate is in a meandered configuration.
Figure 15:
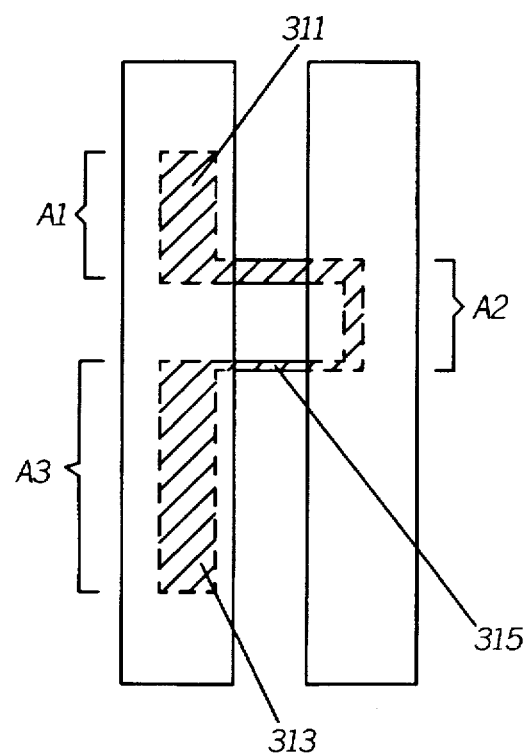
FIG. 15 is a top view of an alternative embodiment of the floating parallel plate coupling structure wherein the parallel plate meandering line incorporates varying section geometries.

An alternative embodiment in the floating plate geometry is illustrated in FIG. 14, the floating plate structure is not segmented, but is a meandered structure 306 that is winding or meandering underneath the coplanar structure 307,309. In this topology, the distance D for the floating plate "section" utilizing the meandering structure 306 is a fixed value. The overlapping surface area is varied, which can be defined by the following Equation (3) as:

$$C_{total}=(e/D)\ (A1+A2+A3+\ldots) \qquad (3)$$

where $C_{total}$=total stray capacitance formed by all parallel plates; e=dielectric of material between plates; A1, A2 . . . =surface area of overlap region 1, 2, . . . ; and D=distance separating plates. It will be noted that in FIG. 14, the overlap regions 305 are equal such that A1=A2=A3. As noted above, it is not necessary that the geometry in the overlap region be equal. These overlap regions can be varied to meet additional dimensional or manufacturing constraints. This is illustrated in FIG. 15, where the areas A1, A2 and A3 are shown unequal in predetermined locations due to the varied size and width of the overlap regions 311, 313 in variable meandering structure 315.

It will also be recognized by those skilled in the art that a new structure could be created using a composite of the innovations noted herein. This could include a meandering line structure combined with a sectioned dashed-line incorporating varying area (A) and distance (D) to form a new "composite" floating plate structure. The previous description of the floating plate structures in FIGS. 9 to 15 are directed towards microstrip based coupler topologies. However, the same techniques can be applied to strip line topologies, embodied in FIGS. 6 to 8, by eliminating the vias and applying the innovations discussed for microstrips. These new embodiments would still incorporate the spirit and the scope of the invention disclosed herein.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A device for bi-directionally coupling radio frequency (RF) energy from a transmission line to a plurality of couplers comprising:

at least one transmission line for carrying energy from an RF source;

at least one forward coupler positioned a predetermined planar distance adjacent to said at least one transmission line for coupling said RF energy moving in a first direction;

at least one reverse coupler positioned a predetermined planar distance adjacent to said at least one transmission line for coupling said RF energy traveling in a second direction;

a first plurality of parallel plates positioned below and extending across portions of said at least one transmission line and said at least one forward coupler for increasing the coupling coefficient and directivity between said at least one transmission line and said at least one forward coupler;

a second plurality of parallel plates positioned below and extending across portions of said at least one transmission line and said at least one reverse coupler for increasing the coupling coefficient and directivity between said at least one transmission line and said at least one reverse coupler;

a ground layer positioned below said first plurality of parallel plates and said second plurality of parallel plates; and wherein a geometry of the first plurality of parallel plates and the second plurality of parallel plates is adjusted such that stray capacitance is distributed for increasing the capacitive coupling of the first parallel plate and the second parallel plate with the at least one forward coupler and the at least one reverse coupler respectively.

2. A device as in claim 1 wherein said parallel plates are substantially V shaped.

3. A device as in claim 1 wherein said parallel plates are substantially oval shaped.

4. A device as in claim 1 wherein adjusting the geometry includes decreasing the area of the first parallel plates and the second parallel plates at predetermined positions.

5. A device as in claim 1 wherein the at least one transmission line, at least one forward coupler, and at least one reverse coupler are a microstrip.

6. A device as in claim 1 wherein the at least one transmission line, at least one forward coupler, and at least one reverse coupler are a stripline.

7. A method of increasing the coupling coefficient of a coupler device which includes at least one transmission line and a coplanar parasitic coupling device comprising the steps of:

positioning a coupling structure in a parallel plane with said at least one transmission line and said coplanar parasitic coupling device;

dividing said coupling structure into a plurality of segments for distributing stray capacitance;

adjusting the geometry of said plurality of segments for minimizing stray capacitance;

varying the distance between each segment of said plurality of segments such that each segment is offset from adjacent segments for e minimizing stray capacitance; and aligning each segment of said coupling structure at varying predetermined distances from said transmission line and said coplanar coupling device so said coupling structure occupies an area which is substantially between said transmission line and said coplanar coupling device.

8. A method as in claim 7 wherein said at least one transmission line and coplanar parasitic coupling device are a microstrip.

9. A method as in claim 7 wherein said at least one transmission line and coplanar parasitic coupling device are a stripline.

10. A method as in claim 7 wherein said plurality of segments are substantially V shaped.

* * * * *